(12) United States Patent
Dangelmaier et al.

(10) Patent No.: US 7,071,571 B2
(45) Date of Patent: Jul. 4, 2006

(54) SEMICONDUCTOR COMPONENT HAVING A PLASTIC HOUSING AND METHODS FOR ITS PRODUCTION

(75) Inventors: Jochen Dangelmaier, Beratzhausen (DE); Horst Theuss, Wenzenbach (DE)

(73) Assignee: Infineon Technoloiges AG, Munich (DE)

( * ) Notice: Subject to any disclaimer, the term of this patent is extended or adjusted under 35 U.S.C. 154(b) by 0 days.

(21) Appl. No.: 10/898,081

(22) Filed: Jul. 23, 2004

(65) Prior Publication Data

US 2005/0051905 A1   Mar. 10, 2005

(30) Foreign Application Priority Data

Jul. 24, 2003   (DE) ................ 103 33 840

(51) Int. Cl.
*H01L 23/48* (2006.01)
*H01L 23/52* (2006.01)
*H01L 29/40* (2006.01)

(52) U.S. Cl. ...................... 257/778; 257/786
(58) Field of Classification Search ............. 257/720, 257/708, 778, 698, 701, 700, 699, 706, 707, 257/783, 786
See application file for complete search history.

(56) References Cited

U.S. PATENT DOCUMENTS

| | | | |
|---|---|---|---|
| 4,383,270 A * | 5/1983 | Schelhorn | ............ 361/707 |
| 5,434,452 A | 7/1995 | Higgins, III | |
| 5,550,402 A | 8/1996 | Nicklaus | |
| 5,877,559 A * | 3/1999 | Takayama et al. | .......... 257/773 |
| 6,090,263 A | 7/2000 | Abys et al. | |
| 6,157,084 A * | 12/2000 | Hino et al. | ........... 257/773 |
| 6,340,606 B1 * | 1/2002 | Hashimoto | ............ 438/106 |
| 6,395,633 B1 | 5/2002 | Cheng et al. | |
| 6,538,209 B1 * | 3/2003 | Ouchi et al. | ............ 174/256 |
| 6,555,021 B1 * | 4/2003 | Vaddi et al. | .......... 252/301.6 S |
| 6,753,612 B1 * | 6/2004 | Adae-Amoakoh et al. | .. 257/774 |
| 6,847,111 B1 * | 1/2005 | Yang et al. | ........... 257/707 |

FOREIGN PATENT DOCUMENTS

| | | |
|---|---|---|
| DE | 101 29 387 | 1/2003 |
| DE | 102 35 332 | 2/2004 |
| EP | 0 592 094 | 2/1999 |
| EP | 0 967 649 | 12/1999 |
| EP | 0 811 706 | 6/2001 |
| EP | 1 271 644 | 1/2003 |
| TW | 0480644 | 3/2002 |

* cited by examiner

*Primary Examiner*—S. V. Clark
(74) *Attorney, Agent, or Firm*—Dicke, Billiq & Czaja, PLLC (57) ABSTRACT

The invention relates to a semiconductor component having a plastic housing which encloses a rewiring structure which has flat conductors embedded in plastic. The flat conductors are formed either by a slotted metal sheet or by elongated contact connecting pads. Arranged on the contact connecting pads are flip-chip contacts of a semiconductor chip within the plastic housing, while external contact pads are connected to the flip-chip contacts via flat conductors or to the semiconductor chip via elongated contact connecting pads.

11 Claims, 6 Drawing Sheets

SEMICONDUCTOR COMPONENT HAVING A PLASTIC HOUSING AND METHODS FOR ITS PRODUCTION

CROSS-REFERENCE TO RELATED APPLICATIONS

This Utility Patent Application claims priority to German Patent Application No. DE 103 33 840.3.1, filed on Jul. 24, 2003, which is incorporated herein by reference.

BACKGROUND

The invention relates to a semiconductor component having a plastic housing, which encloses a rewiring structure. The rewiring structure is formed by flat conductors embedded in plastic and/or by elongated contact connecting pads. Furthermore, the invention relates to a carrier structure and to a blank, which have component positions arranged in rows and/or columns for the semiconductor components according to the invention. Finally, the invention relates to methods for producing the carrier structure, the blank and the semiconductor components.

Standardized flat conductors and flat conductor-free plastic housings are not provided for rewiring or for routing wiring and/or for making through contacts. Both the upper side and the rear side of flat conductor frames, which are used for flat conductors and/or flat conductor-free plastic housings, have the same geometric structure, both for external flat conductor connections and for internal flat conductor connections, so that decoupling the chip side or upper side of the flat conductors from the board side or external contact side on the rear side of the flat conductors is possible only to a restricted extent.

In order to route the chip side and external contact side, complicated multilayer systems, for example made of ceramic with metallic intermediate layers, are used. Multilayer substrates of this kind are formed as a carrier structure and are produced by laminating various insulating layers with structured conductor tracks. In this case, the electrical connection between the conductor tracks and the laminated layers is made via through contacts. Such carrier structures comprising multilayer substrates for rewiring and routing are too complicated and too costly for flat conductor-free plastic housings.

SUMMARY

In one embodiment of the invention, borrowing from the production methods for producing flat conductor-free plastic housings, a semiconductor component is specified with a rewiring layer. Furthermore, a method is specified for the production of the semiconductor component which can be carried out economically.

According to one embodiment of the invention, a semiconductor component having a plastic housing is provided, which encloses a rewiring structure. For this purpose, the plastic housing has flat conductors embedded in plastic as the rewiring structure. These flat conductors have an upper side, on which there are arranged contact connecting pads which are connected to flip-chip contacts of a semiconductor chip within the plastic housing. Arranged on the rear side of the flat conductors are external contact pads, which project from the housing and whose positions with respect to the positions of the flip-chip contacts have an offset which is bridged by the flat conductors. While the external contact pads and the contact connecting pads have an identical first metal alloy, the flat conductors have a different alloy from the first metal alloy.

The semiconductor component according to one embodiment of the invention has the advantage that the rewiring structure can be structured with a fine mesh based on flat conductors such that the rewiring structure itself can even exert a shielding action in order to protect the semiconductor chip arranged thereon with flip-chip contacts. Thus, the present semiconductor component has improved high frequency properties as compared with semiconductor components with standardized flat conductor housings or with flat conductor-free housings. A further advantage resides in the formation of external contact areas, which are formed on the rear side of the flat conductors and thus permit surface mounting of the semiconductor component on a primary circuit board. The further advantage of this electronic component as compared with standardized flat conductor components resides in the fact that no kind of bonding wire connections are required in order to connect the semiconductor chip to the contact connecting pads on the flat conductors.

In one embodiment, with the semiconductor component according to the invention the geometry of the contact connecting pads on the chip side is decoupled from the external contact pads on the board side. Also, during the production of the contact connecting pads and the external contact pads, a coordinated selection of materials, for example by means of wet chemical deposition of nickel-gold alloys, surfaces that can be soldered and/or bonded are produced without these having to be further finished. As compared with standard flat conductor-free components, a process step is omitted with one embodiment of the present invention. Namely, the removal of the otherwise usual basic material of an auxiliary carrier following a molding operation for embedding the semiconductor chip in a plastic compound is omitted. As a result of using flat conductors as rewiring structure, there is a solid material as the conductor track plane, which permits excellent electrical properties, in particular in the high frequency range.

The contact connecting pads and the external contact pads can have typical deposition contours with protruding edge zones. In this way, intensive anchoring of the contact connecting pads in the plastic housing becomes possible. Furthermore, because of the protrusions, the external contact pads have a larger external contact area than their contact area to the flat conductors.

The flat conductors can have typical punching and/or etching contours at their edges, depending on the method with which the flat conductors have been produced from a self-contained sheet of a copper alloy or an iron-nickel alloy. Both cases maybe advantageous for use in a semiconductor component of one embodiment of the present invention. Both by means of a punching step and by means of an etching step, many component positions of a carrier structure for the semiconductor component according to the invention can be produced simultaneously.

A finished carrier structure for the semiconductor components according to one embodiment of the invention has a plurality of component positions arranged in rows and/or in columns. The base of the carrier structure forms a slotted metal sheet, which has a flat conductor frame between the component positions and, in the component positions, forms a rewiring structure of flat conductors.

Arranged on the upper sides of the flat conductors are contact connecting pads surrounded by plastic, and arranged on the rear sides of the flat conductors are external contact pads surrounded by plastic. A carrier structure of this type corresponds to a conventional flat lead frame in some regions, but has a plastic coating on both sides and has deposited metal pads on both sides, which firstly, on the chip side, can serve as contact connecting pads for flip-chip contacts of an electronic component and, secondly, on the board side of the flat conductors, form external contact pads.

The plastic coating that surrounds both the contact connecting pads and the external contact pads can be a cured photoresist that has been applied to both sides of the slotted metal sheet in order to form external contact connecting pads and external contact pads. These photoresist layers can also be partly or completely removed from the carrier structure before the application of a plastic compound to embed semiconductor chips, so that the contact connecting pads and the external contact pads are surrounded by a molded plastic housing compound.

One embodiment of the invention relates to a semiconductor component having a plastic housing, which encloses a rewiring structure. In this embodiment of the invention, no slotted metal sheet which remains as such in the finished semiconductor component is used. Instead, a self-contained metal sheet forms the basis of the construction of such a semiconductor component, the major part of this self-contained metal sheet being removed by etching after the production of a composite board for a plurality of semiconductor components. The rewiring structure is consequently not formed by flat conductors from the metal sheet but by elongated contact connecting pads.

On their upper side, these elongated contact connecting pads have flip-chip contacts of a semiconductor chip which is arranged within the plastic housing. Arranged on the rear side of the elongated contact connecting pads are external contact pads, whose position with respect to the positions of the flip-chip contacts has an offset which is bridged by the elongated connecting pads. In this embodiment of the invention, the external contact pads have first and second regions layered above one another and made of different metal alloys.

With this semiconductor component, the external contact pads project further from the plastic housing as compared with the semiconductor component of the first embodiment of the invention. While, in the first embodiment of the invention, a semiconductor component is presented in which only a protruding region of the external contact pads projects out of the plastic housing, there is now available for the connection of primary circuits an external contact which has the full material thickness of the external contact pads plus a material thickness which is caused by the metal base sheet. While the metal base sheet can be etched away around the external contact pad, a subregion with a typical etched contour and made of the material of the base metal sheet remains as a connection between the external contact pad and the elongated contact connecting pad.

In this case, the first region of the external contact pads is arranged on the rear side of the elongated contact connecting pads and has a metal alloy which is different from a metal alloy of the contact connecting pads. The second region, which is arranged on the first region, has the same metal alloy as the elongated contact connecting pads. This metal alloy can be a gold-nickel alloy which can both be soldered and bonded, and thus external contacts structured in this way can be applied without difficulty to a primary printed circuit board.

While the first region of the external contact pads has a typical undercut contour as external contour, the elongated contact connecting pads and the second region of the external contact pads have a typical deposition contour with protruding edge zones. One advantage of this semiconductor component resides in the fact that in the edge zones of the semiconductor components there is no composite material comprising plastic and flat conductors, as in the first embodiment of the invention, but that the side edges consist completely of plastic, which makes it easier to process the side edge, in particular when separating a blank to form individual semiconductor components.

A corresponding carrier structure having a plurality of component positions arranged in rows and/or columns for semiconductor components of the second embodiment has a self-contained metal base sheet, on the upper side of which rewiring structures are arranged in the component positions. These rewiring structures are constituted by elongated contact connecting pads surrounded by plastic. On the rear side of the metal sheet, corresponding external contact pads surrounded by plastic are arranged in the component positions.

This carrier structure can be produced at low cost as the carrier structure for a semiconductor component of the first embodiment of the invention, particularly since the metal sheet does not have to be structured but merely needs initially to be provided on both sides with a photoresist layer, in which windows can then be opened in order to form the elongated contact connecting pads as rewiring lines and the external contact pads. Since a self-contained metal base sheet of this type short-circuits all the external contacts, this metal sheet of the carrier structure is partly removed after the completion of a composite board comprising plastic housing compound, semiconductor chips and carrier structure, and a blank is formed.

A method for producing a carrier structure for a plurality of components of the first embodiment of the invention has several steps.

First, a metal sheet made of a copper alloy or a nickel alloy is provided. The metal plate is then structured to form component positions arranged in rows and columns, the component positions having flat conductors which are held in position by a flat lead frame. Then, the structured metal sheet is coated with a photoresist layer both on its upper side and on its rear side. After that, the photoresist layers are structured with the provision of windows for contact connecting pads on the upper side and for external contact pads on the rear side of the flat conductors.

The positions of the windows on the upper side and the rear side are arranged offset from one another, so that a rewiring structure is produced. Finally, a nickel-gold alloy is deposited in the windows on the upper side and rear side of the flat conductors, forming protrusions on the windows. This deposition can be carried out chemically and therefore without power or electrically by means of electroplating. From this carrier structure, with further method steps, a blank having component positions arranged in rows and columns can then be produced. For this purpose, the carrier structure is populated in its component positions with semiconductor chips which have flip-chip contacts, connecting the flip-chip contacts to the contact connecting pads.

Following the population of the carrier structure with semiconductor chips, a plastic compound is applied to the upper side of the carrier structure populated with semiconductor chips, embedding the semiconductor chips and their flip-chip contacts. If the underside of the carrier structure is also to be coated with a plastic compound, then, before the application of the plastic compound of the housing, the photoresist layers on the carrier structure are removed by being incinerated or by being dissolved. With this method, the structured metal sheet does not have to be removed, and instead it performs the function of a rewiring structure in the housing.

The blank completed in this way for the production of a semiconductor component of the first embodiment of the invention can then be divided up into individual semiconductor components, removing the flat lead frame. For this purpose, sawing apparatuses with saw blades are required, which sever both the plastic compound and the metal of the flat lead frame. Since the flat lead frame has to be removed completely during the division, the plastic for the housing can also be sprayed on only in the component positions by means of appropriate molding tools and, with a subsequent punching process, the separation of the components can be carried out in the region of the metallic plastic-free flat lead frame. Although this requires greater expenditure for the molding tool, the division through two separate materials, such as plastic and metal, is avoided.

A method for producing a carrier structure for a plurality of semiconductor components of the second embodiment of the invention has several steps. First, a self-contained metal sheet made of copper alloy is provided, which is coated on its upper side and on its rear side with a photoresist layer. Then, the photoresist layers are structured to form component positions arranged in rows and columns with the provision of windows for elongated contact connecting pads on the upper side and for external contact pads on the rear side of the metal sheet in the component positions. Finally, in order to produce the carrier structure, a gold-nickel alloy is deposited in the windows on the upper side and the rear side of the metal sheet, forming protrusions on the windows.

Therefore, the method steps for the carrier structure for producing a semiconductor component of the second embodiment differ from the method steps for producing a carrier structure of the first embodiment in that the metal sheet provided, made of copper alloy or an iron-nickel alloy, is not structured and contact pads of different lengths are deposited on this metal sheet. On the upper side, elongated contact connecting pads are formed, while only external contact pads are provided on the underside, corresponding appropriately to the position of one end of one of the elongated contact connecting pads. The elongated connecting pads thus perform the function of rewiring lines of a rewiring structure.

On the basis of this carrier structure, it is then possible to produce a blank that has component positions in rows and columns. In detail, for this purpose, the carrier structure is populated in its component positions with semiconductor chips that have flip-chip contacts and these flip-chip contacts are connected electrically to the elongated contact connecting pads. After that, a plastic compound is applied to the upper side of the carrier structure populated with semiconductor chips, embedding the semiconductor chips and their flip-chip contacts and forming a composite board.

In a following step, the photoresist layer on the rear side of the carrier structure is removed. For this purpose, the composite board is immersed in a copper etching solution or an etching solution for iron-nickel alloys, etching away the metal sheet made of a copper alloy or iron-nickel alloy. This copper or iron-nickel alloy is, however, etched away only outside the external contact pads made of a gold-nickel alloy and forms external contact pads which have first and second regions made of different metal alloys layered above one another.

In order that, after the metal sheet has largely been etched away, the external contact pads are connected to the elongated contact connecting pads, it is necessary, as early as during the production of the carrier structure, for the opening of the windows in the photoresist layers to be carried out in such a way that the windows for the external contact pads on the rear side of the metal sheet are located in the region of the elongated contact connecting pads. After the metal sheet has largely been etched away, a blank is available which can then be divided along the rows and columns into individual semiconductor components to form semiconductor components of the second embodiment. With this method, only one material, namely the plastic housing compound, is arranged in the dividing tracks, which makes the selection of the saw blade and the sawing into individual semiconductor components easier.

On the other hand, it is possible that, during the etching of the metal sheet, only continuous trenches are etched into the metal, in order to maintain a large-area metal coating of the semiconductor component. In this case, the configuration of the semiconductor component of the second embodiment of the invention corresponds to the configuration of the semiconductor component of the first embodiment, only the introduction of the slots already being carried out at the start in the first embodiment of the invention and introduction of the slots being a penultimate step in the second embodiment of the invention, before the rear side of the semiconductor component is protected by an insulating layer or passivation layer, which leaves only the external contact pads free.

Apart from the aforementioned sawing or punching for the purpose of separating the semiconductor components from the blank, laser cutting or water jet cutting can also be used, the cutting means depending on the cost-benefit principle and the possibilities of the manufacturer. The carrier structures are commercial articles and can be marketed in addition to the semiconductor components, it being possible for the form of the carrier structures to be prepared in a strip-like, rectangular or wafer-like manner, in order to utilize available technologies for the economical production of the components according to the invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
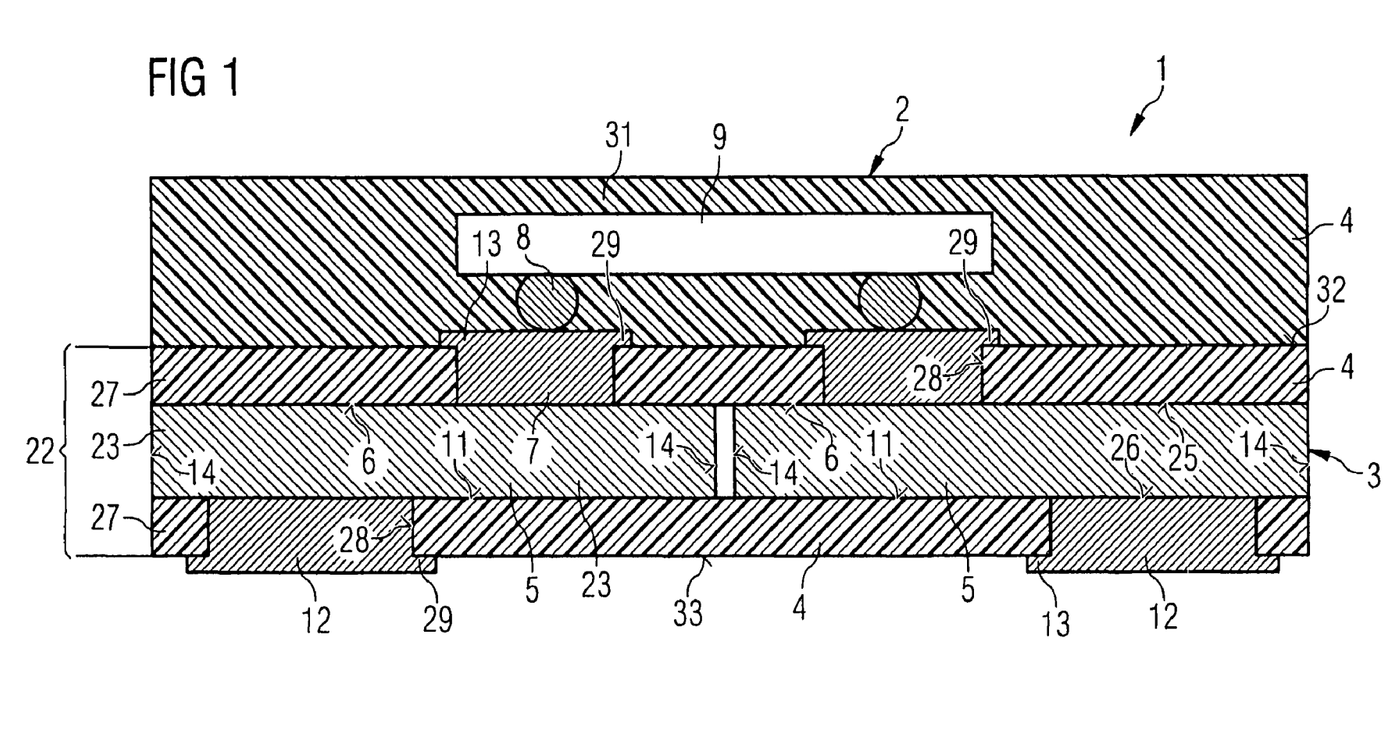
FIG. 1 illustrates a schematic cross section through a semiconductor component of a first embodiment of the invention.

FIG. 1 illustrates a schematic cross section through a semiconductor component 1 of the first embodiment of the invention. The semiconductor component 1 has a plastic housing 2, which is carried by a slotted metal sheet 23 of a copper alloy or iron-nickel alloy. This metal sheet 23 has slots 34, which divide up the metal sheet 23 into large-area flat conductors 5 and form a rewiring structure 3.

The flat conductors 5 have an upper side 6 and a rear side 11. The side edges 14 of the flat conductors 5 are punched in this embodiment of the invention and, consequently, do not exhibit an etched contour but smooth edges 14. Both on the upper side 25 of the metal sheet 23 and on the rearside 26 of the metal sheet 23 there is arranged a layer of plastic 4, which constitutes cured photoresist layers 27. The cured photoresist layer arranged on the upper side 25 of the metal sheet 23 has windows 28, which are filled with an electrodeposited gold-nickel alloy and form contact connecting pads 7 and have protrusions 29, which are formed automatically during the deposition process, deposited on the windows.

Soldered on to this solderable gold-nickel alloy are flip-chip contacts 8 of a semiconductor chip 9, the semiconductor chip 9 and the flip-chip contact 8 being embedded completely in the plastic 4 of the plastic housing 2. The photoresist layer 27 of the rear side 26 of the metal sheet 23 likewise has windows 28 in the photoresist layer 27, which are filled at the same time as the windows 28 of the photoresist layer 27 on the upper side 25 of the metal sheet 23 by means of deposition of a gold-nickel alloy to form external contact pads and likewise have protrusions 29.

In the design of this component, use is made of a slotted metal sheet in order to constitute flat conductors 5, the flat conductors 5 carrying the contact connecting pads 7 on their upper sides 6 and having external contact pads 12 on their rear sides 11. The contact connecting pads 7 are not just smaller and matched to the micro dimensions of the flip-chip contacts but are also arranged with an offset from the external contact pads 12. Thus, the external contact pads can be configured to be larger than the contact connecting pads 7, so that it is possible to apply to the external contact pads 12 external contacts which have a diameter which is an order of magnitude larger than the diameter of the flip-chip contacts 8 that are directly connected to the semiconductor chip 9.

As a result of the slotted metal sheet 23, in addition to increased stability of the semiconductor component 1, improved shielding of the semiconductor component 1 with respect to interfering fields is also achieved, since the flat conductors 5 are of large-area design and interfering radiation could be scattered in only through narrow slots 34. In order to improve such a semiconductor component 1 further, in particular in terms of its high frequency properties, it is also possible to cover the plastic housing 2 with a further metal plate.

Figure 2:
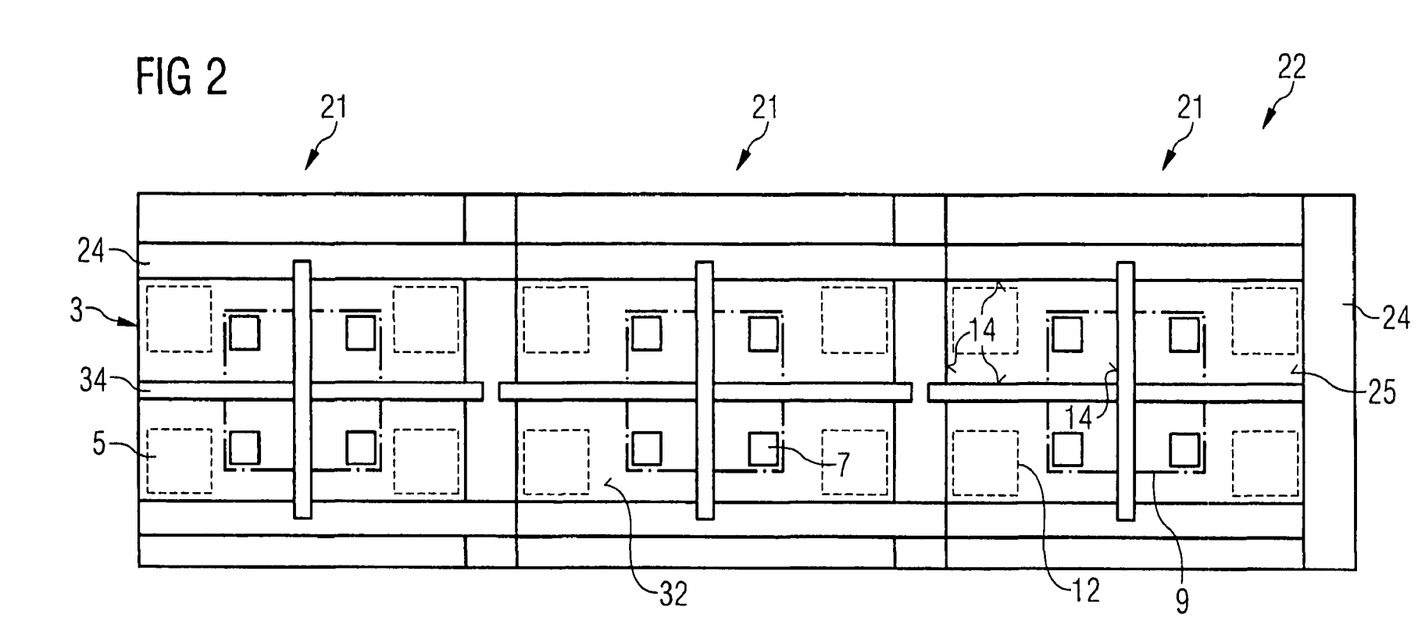
FIG. 2 illustrates a schematic plan view of a carrier structure having component positions arranged in rows and columns for semiconductor components according to FIG. 1.

FIG. 2 illustrates a schematic plan view of a carrier structure 22 having component positions 21 arranged in rows and columns for semiconductor components 1, according to the first embodiment of the invention, as illustrated in FIG. 1. Arranged in each of the component positions 21 shown here are four flat conductors 5, which are separated from one another by punched slots 34 and are held together by a flat lead frame 24. Arranged on the upper sides 6 of the flat conductors 5 are contact connecting pads 7, while on the rear side of the flat conductors 5, not visible in the plan view illustrated in FIG. 2, there is in each case arranged an external contact pad 12 which, in this illustration, is shown by a dashed line.

The external contact pads 12 are larger as compared with the contact connecting pads 7 and are arranged offset therefrom on the rear sides of the flat conductors 5. This offset is bridged electrically by the flat conductor 5. Furthermore, the position of the semiconductor chips 9 in each of the component positions 21 is shown by dash-dotted lines. The flat lead frame 24, which holds the flat conductors 5 in position, is punched out after the semiconductor components in the component positions 21 have been completed, so that a short-circuit of the rewiring lines via the flat conductor 5 is no longer present. The number of four flat conductors 5 per component position 21 shown here can be increased as desired by means of appropriate introduction of further slots 34 in each of the component positions 21, so that a dense network of flat conductors 5 is produced, the flat conductors 5 having the respectively one contact connecting pad 7 on their upper side 6 and an external contact pad 12 on their rear side.

The following FIGS. 3–6 illustrate intermediate products which can also be used as commercial goods and are produced during method steps for the production of a semiconductor component according to the first embodiment of the invention.

Figure 3:
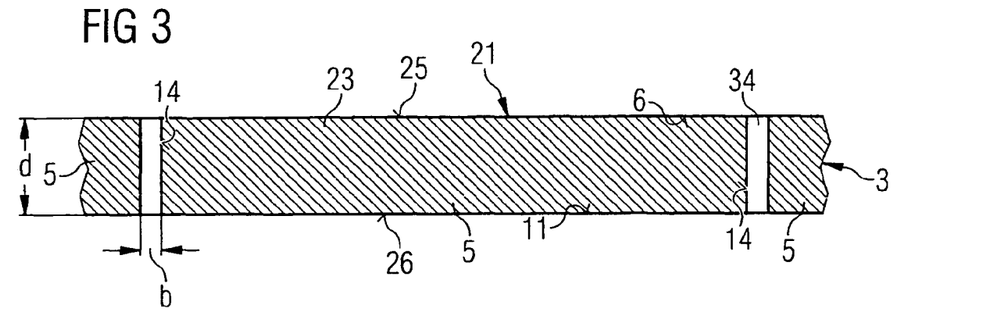
FIG. 3 illustrates a schematic cross section through a metal sheet having punched slots as the basis of a carrier structure for components according to FIG. 1.

FIG. 3 illustrates a schematic cross section through a metal sheet 23 having punched slots 34 as the basis of a carrier structure for components according to FIG. 1. This metal sheet 23, made of a copper alloy or an iron-nickel alloy, in this embodiment of the invention has a thickness d of 0.05 to 2 mm and has punched or sawn slots 34 which have a width b between 0.05 and 2 mm. By means of the slots 34, individual flat conductors 5 are separated from one another in such a way that they are still held in position only by a flat lead frame, not shown here. A metal sheet 23 prepared in this way can subsequently be provided with a photoresist layer on both sides.

Figure 4:
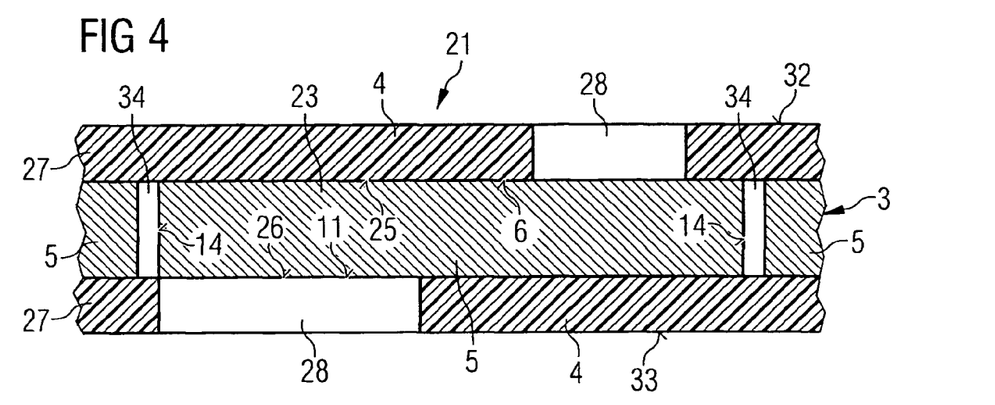
FIG. 4 illustrates a schematic cross section after the application of a photoresist layer to both sides of the slotted metal sheet according to FIG. 3.

FIG. 4 illustrates a schematic cross section following the application of a photoresist layer 27 to both sides of the slotted metal sheet 23, according to FIG. 3. The photoresist layer 27 on the upper side 25 of the metal sheet 23, following appropriate exposure and development, has on the upper side 6 of a flat conductor 5 a window 28 which is provided for a contact connecting pad. The photoresist layer 27 on the rear side 26 of the metal sheet 23 has a window 28 which is arranged on the rear side 11 of a flat conductor 5 for external contact pads. The windows 28 in the photoresist layer 27 on the upper side 25 of the metal sheet 23 and on the rear side 26 of the metal sheet 23 differ firstly in size and secondly in their arrangement on the flat conductor 5. The window 28 on the upper side 6 of the flat conductor 5 is smaller and matched to the size of flip-chip contacts of a semiconductor chip, while the window 28 on the rear side 11 of the flat conductor 5 is larger and offset with respect to the window 28 on the upper side 6. This offset makes it possible to provide larger external contact pads for corresponding external contacts of a semiconductor component.

Figure 5:
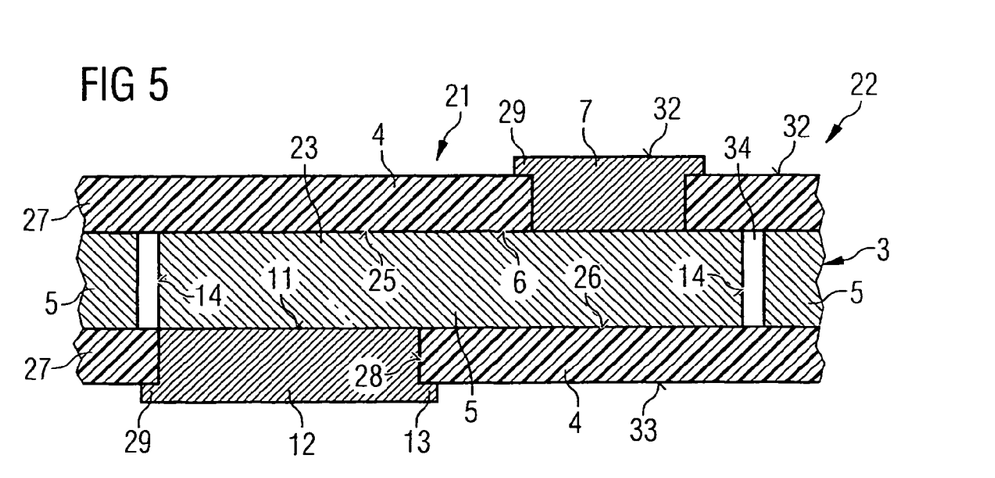
FIG. 5 illustrates a schematic cross section through a carrier structure following deposition of contact connecting pads on the upper side and rear side of the slotted metal sheet according to FIG. 4.

FIG. 5 illustrates a schematic cross section through a carrier structure 22 following the deposition of contact connecting pads 7 on the upper side 25 and external contact pads 12 on the rear side 26 of the slotted metal sheet 23 according to FIG. 4. By means of lengthy deposition of a metal alloy, such as gold-nickel, in the windows 28, a protrusion 29 on the windows 28 is achieved. This protrusion 29 can contribute to improved anchoring of the contact connecting pads 7 in the plastic 4 of a plastic housing. Removal of the photoresist layers 27 on the rear side 26 and the upper side 25 of the structured metal sheet 23 is not required, so that an incineration step or a step of dissolving the cured photoresist layers 27 on the upper side 25 and the rear side 26 can be avoided. Nevertheless, it is possible to provide the photoresist layers 27 before the further processing of the slotted and structured metal sheet 23.

Figure 6:
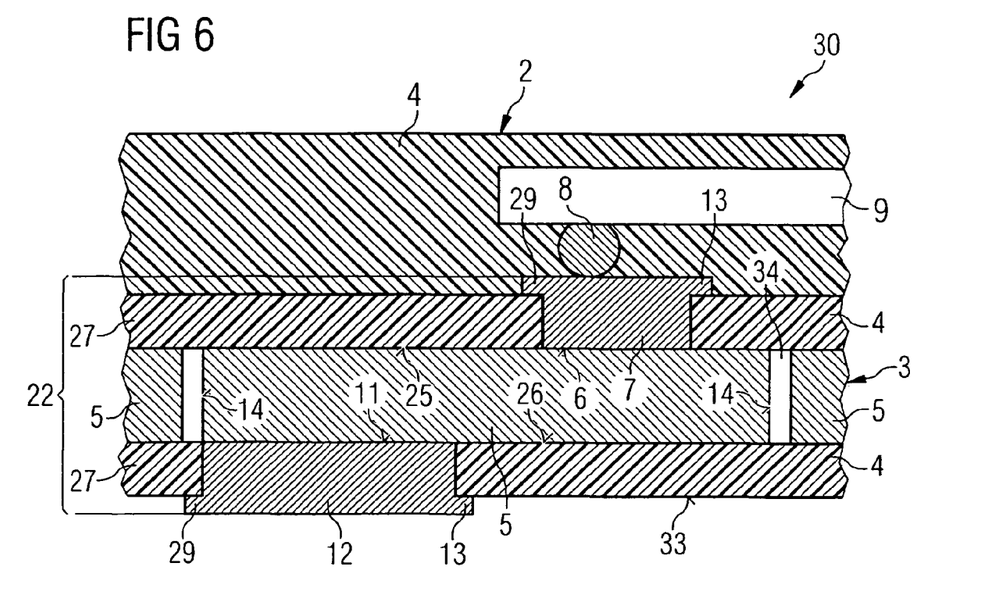
FIG. 6 illustrates a schematic cross section through a blank following application of semiconductor chips to the carrier structure, according to FIG. 5 and embedding the semiconductor chips in a plastic compound.

FIG. 6 illustrates a schematic cross section through a blank 30 following the application of semiconductor chips 9 to the carrier structure 22, according to FIG. 5, and embedding the semiconductor chips 9 in a plastic compound 31. In this illustration, only a detail of the blank 30 is shown, having component positions 21 arranged in rows and columns. As FIG. 2 illustrates, the blank 30 is built up in the form of a strip of a plurality of semiconductor positions lined up in a row. Alternatively, the blank 30 can also have a wafer form or a board form, which has a plurality of component positions 21 for corresponding semiconductor components 1.

In order to produce a component, as is illustrated in FIG. 1, from this blank 30, the component positions 21 are divided along the rows and columns and, in the process, the flat lead frame 24 illustrated in FIG. 2 is punched out, so that no short circuits can occur between the flat conductors 5. The semiconductor components produced in this case correspond to the embodiment according to FIG. 1 and, in the side edges of their components, have free side edges of the flat conductors 5, which are not covered by plastic 4. While the material of these flat conductors 5 corresponds to the material of the slotted metal sheet 23, the material of the deposited external contact pads 12 and of the deposited contact connecting pads 7 is identical and different from the material of the slotted metal sheet 23.

Figure 7:
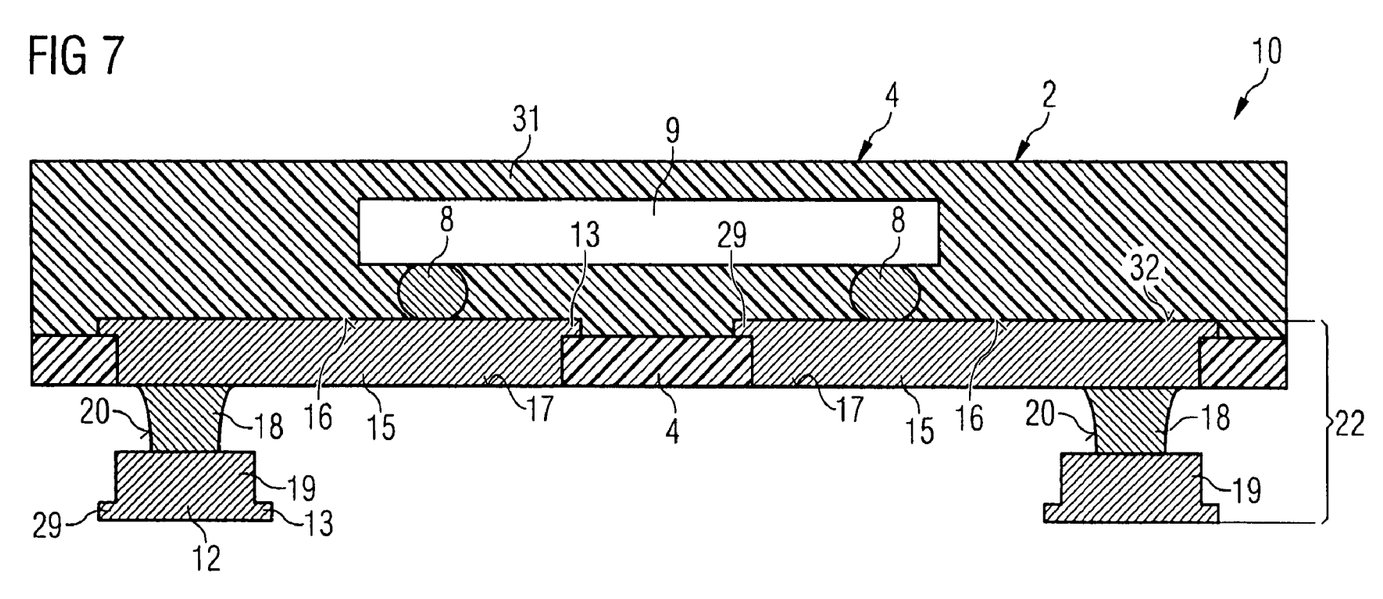
FIG. 7 illustrates a schematic cross section through a semiconductor component of a second embodiment of the invention.

FIG. 7 illustrates a schematic cross section through a semiconductor component 10 of a second embodiment of the invention. Components with the same functions as those in the preceding figures are identified by the same designations and not specifically explained. The second embodiment of the invention differs from the first embodiment of the invention in the fact that the contact connecting pads 15 are elongated, have an upper side 16 and a rear side 17 and are therefore larger than corresponds to the flip-chip contacts 8 of the semiconductor chip 9. Furthermore, the material of the metal sheet 23 of the carrier structure 22 illustrated in FIG. 1 is etched away, apart from residues which are covered by the external contact pads 12. As a result of etching away the metal sheet consisting of a copper alloy or of a nickel-iron alloy, the contact connecting pads 12 have, in addition to the contour of a protrusion 29, an external contour 20 in the first region which has been produced by etching away the metal sheet. Thus, the external contact pads 12 have a first region 18 with an etched contour as external contour 20, and a second region 19 with protruding edge zones 13, the materials of the first region 18 and the second region 19 differing from each other. While the first region 18 has a copper alloy or a nickel-iron alloy, the second region 19 has a gold-nickel alloy.

In any case, this external contact pad 12 is connected to the elongated contact connecting pad 15, which additionally performs the function of rewiring lines. The offset between external contact pad 12 and flip-chip contacts 8 is bridged electrically by the elongated contact connecting pads 15. Instead of largely etching away the metal sheet of the carrier structure 22, this metal sheet can also merely have etched tracks which are arranged in a similar form to that of the etched slots in the first embodiment of the invention. In this case, the second embodiment of the invention then differs from the first embodiment of the invention only in the fact that the photoresist layer is not present on the rear side 26 of the slotted metal sheet 23 illustrated in FIG. 1.

Figure 8:
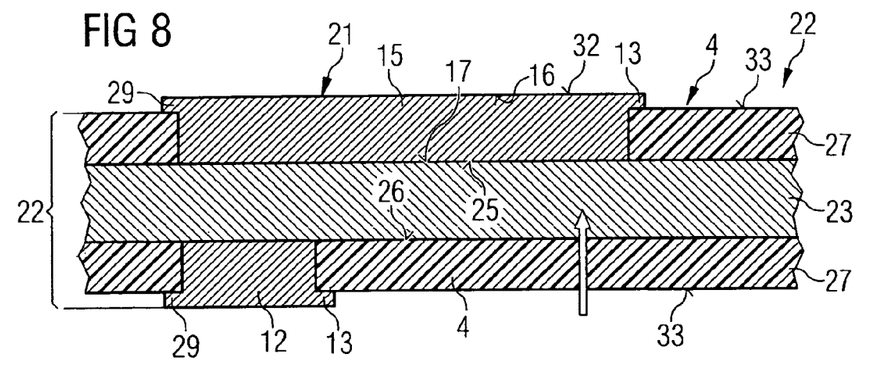
FIG. 8 illustrates a schematic cross section through a carrier structure for producing the semiconductor component according to FIG. 1.

FIG. 8 illustrates a schematic cross section through a carrier structure 22 having an upper side 32 and a rear side 33 for producing the semiconductor component 10 according to FIG. 1. The difference with this carrier structure 22 as compared with the carrier structure according to FIG. 5 is that, for the second embodiment of the invention, a self-contained metal sheet 23 is used in the carrier structure 22, and the contact connecting pads 15 in the photoresist layer 27 on the upper side 25 of the metal sheet are elongated and therefore bridge the offset between the positions of flip-chip contacts and external contact pads 12 electrically.

Figure 9:
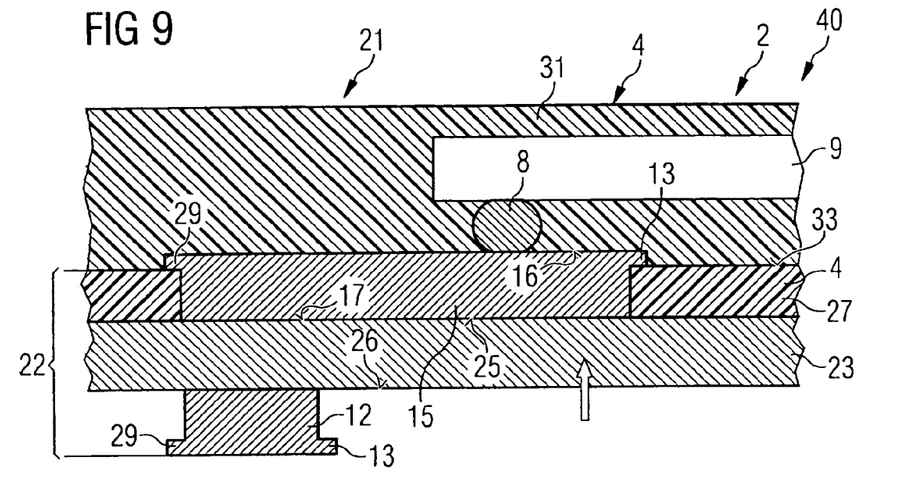
FIG. 9 illustrates a schematic cross section through a composite board following the application of semiconductor chips to the carrier structure according to FIG. 8.

FIG. 9 illustrates a schematic cross section through a composite board 40 following the application of semiconductor chips 9 to the carrier structure 22 according to FIG. 8. The semiconductor chips 9 on the carrier structure 22 are embedded in a plastic compound 31 which subsequently constitutes the component housing. Furthermore, in FIG. 9, the photoresist layer 27 on the rear side 26 of the self-contained metal sheet 23 has been removed. This removal is achieved by incinerating the photoresist layer 27 or by dissolving the photoresist layer 27 in an oxidizing liquid. The composite board 40 is thus still supported by the metal sheet 23, which has for the most part been removed in FIG. 10.

Figure 10:
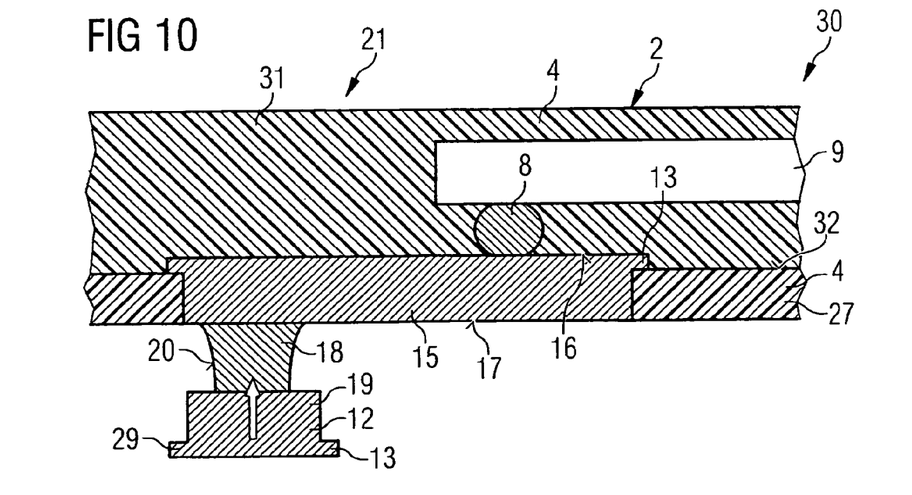
FIG. 10 illustrates a schematic cross section through a blank following partial removal of the metal sheet of the composite board according to FIG. 9.

FIG. 10 illustrates a schematic cross section through a blank 30 following partial removal of the metal sheet 23 of the composite board 40 according to FIG. 9. The removal of the metal sheet is achieved by means of a metal etching solution, which is matched specifically to the material of the metal sheet 23, so that the external contact pads 12 of the carrier structure 22, as FIG. 8 illustrates, are maintained and a residue of the metal sheet 23 illustrated in FIG. 9 remains, since it is partly protected against etching attack by the unetched material of the external contact pad 12. Thus, the remaining external contact pad 12 comprises a first region 18, which has an etched contour as external contour 20, and a second region 19, which has a protrusion 29. The materials of these two regions 18, 19 are different from each other. In order to produce individual electronic components, as FIG. 7 illustrates, from this blank 30, it is merely necessary to divide the individual component positions 21 of the blank 30 from one another, which is carried out, for example, by sawing up the plastic compound 31 along the rows and columns of the blank 30.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a rewiring structure having flat conductors with an upper side and a rear side, the flat conductors further comprising portions of a metal sheet and being embedded in a layer of plastic;
   contact connecting pads arranged on the upper side of the flat conductors;
   flip-chip contacts of a semiconductor chip that are connected to the contact connecting pads;
   external contact pads that are arranged on the rear side of the flat conductors, and positioned with respect to the positions of the flip-chip contacts to have an offset that is bridged by the flat conductors; and
   a plastic housing enclosing the semiconductor chip and the flip-chip contacts;
   wherein the external contact pads and the contact connecting pads have an identical first metal alloy and the flat conductors have a different alloy from the first metal alloy.

2. The semiconductor component of claim 1, wherein the contact connecting pads and the external contact pads have typical deposition contours with protruding edge zones.

3. The semiconductor component of claim 1, wherein the flat conductors have typical punching and etching contours at their edges.

4. The semiconductor component of claim 1, wherein the flat conductors have typical punching or etching contours at their edges.

5. A semiconductor component comprising:
   a rewiring structure, having elongated contact connecting pads covered by plastic, the elongated contact connecting pads further comprising portions of a metal sheet and having an upper side and a rear side;
   flip-chip contacts of a semiconductor chip arranged on the upper side of the elongated contact connecting pads;
   external contact pads that are arranged on the rear side of the elongated contact connecting pads and whose positions with respect to the positions of the flip-chip contacts have an offset that is bridged by the elongated contact connecting pads; and
   a plastic housing enclosing the semiconductor chip and the flip-chip contacts;
   wherein the external contact pads have first and second regions of different metal alloys that are layered above one another.

6. The semiconductor component of claim 5, wherein the first region of the external contact pads is arranged on the rear side of the contact connecting pads and has a different metal alloy from the metal alloy of the contact connecting pads.

7. The semiconductor of claim 6, wherein the second region, which is arranged on the first region, has the same metal alloy as the contact connecting pads.

8. The semiconductor component of claim 5, wherein the first region of the external contact pads has a typical undercut contour as external contour.

9. The semiconductor component of claim 5, wherein the elongated contact connecting pads and the second region of the external contact pads have a typical deposition contour with protruding edge zones.

10. A carrier structure comprising:
    a plurality of component positions arranged in rows and in columns;
    a slotted metal sheet forming a flat lead frame between the component positions and a rewiring structure in the component positions;
    at least one semiconductor component in one of the component positions, the semiconductor component comprising:
    the rewiring structure, which comprises flat conductors having an upper side and a rear side, the flat conductors being embedded in a layer of plastic;
    contact connecting pads arranged on the upper side of the flat conductors;
    flip-chip contacts of a semiconductors chip being connected to the contact connecting pads;
    external contact pads that are arranged on the rear side of the flat conductors, whose positions with respect to the positions of the flip-chip contacts have an offset that is bridged by the flat conductors; and
    a plastic housing that encloses the semiconductor chip and the flip-chip contacts;
    wherein the external contact pads and the contact connecting pads have an identical first metal alloy and the flat conductors have a different alloy from the the first metal alloy.

11. A carrier structure comprising:
    a plurality of component positions arranged in rows and columns;
    a self-contained metal sheet on whose upper side rewiring structures are arranged in the component positions;
    at least one semiconductor component in one of the component positions, the semiconductor component comprising:
    the rewiring structure, which comprises flat conductors having an upper side and a rear side, the flat conductors being embedded in a layer of plastic;
    contact connecting pads arranged on the upper side of the flat conductors;
    flip-chip contacts of a semiconductors chip being connected to the contact connecting pads;
    external contact pads that are arranged on the rear side of the flat conductors, whose positions with respect to the positions of the flip-chip contacts have an offset that is bridged by the flat conductors; and
    a plastic housing that encloses the semiconductor chip and the flip-chip contacts;
    wherein the external contact pads and the contact connecting pads have an identical first metal alloy and the flat conductors have a different alloy from the the first metal alloy.

* * * * *